US012699135B1

(12) United States Patent
Tully et al.

(10) Patent No.: US 12,699,135 B1
(45) Date of Patent: Aug. 4, 2026

(54) IN-SITU SCAN TESTING OF AN INTEGRATED CIRCUIT DEVICE

(71) Applicant: Amazon Technologies, Inc., Seattle, WA (US)

(72) Inventors: Brendan Tully, Austin, TX (US); Matthew John Tilleman, Austin, TX (US); Teja Adike, Georgetown, TX (US); Don Tien Nguyen, Round Rock, TX (US); Amit Pandey, Austin, TX (US); Akshay Maganti Vijay Kumar, Leander, TX (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 18/979,266

(22) Filed: Dec. 12, 2024

(51) Int. Cl.
*G01R 31/3177* (2006.01)

(52) U.S. Cl.
CPC .............................. *G01R 31/3177* (2013.01)

(58) Field of Classification Search
None
See application file for complete search history.

(56) References Cited

U.S. PATENT DOCUMENTS

2013/0124934 A1* 5/2013 Jones ................. G01R 31/3177
714/727
2020/0096569 A1* 3/2020 Mishaeli ........ G01R 31/318533

2021/0057036 A1* 2/2021 Khan ..................... G11C 29/38
2021/0193615 A1* 6/2021 Kwon .................... H10P 74/273
2021/0231732 A1* 7/2021 Park ......................... G11C 29/32
2021/0294791 A1* 9/2021 Narayanaswamy .... G06F 11/27
2022/0365857 A1* 11/2022 Chadalavada ...... G06F 11/2733
2023/0056118 A1* 2/2023 Clark ................. H03K 19/1776
2023/0063588 A1* 3/2023 Werhane ............. G06F 13/4282
2025/0110175 A1* 4/2025 Kandula .......... G01R 31/31917
2025/0306101 A1* 10/2025 Ghosh ............ G01R 31/318385

OTHER PUBLICATIONS

H. Jun, S. Nam, H. Jin, J. -C. Lee, Y. J. Park and J. J. Lee, "High-Bandwidth Memory (HBM) Test Challenges and Solutions," in IEEE Design & Test, vol. 34, No. 1, pp. 16-25, Feb. 2017, (Year: 2017).*

* cited by examiner

*Primary Examiner* — Daniel F. McMahon
(74) *Attorney, Agent, or Firm* — Weaver Austin Villeneuve & Sampson LLP

(57) ABSTRACT

A method for performing in-situ scan testing of an integrated circuit (IC) device that is coupled to a main memory is described. The IC device has a plurality of functional circuit blocks, a management controller, and a local memory coupled via an interconnect. Test content is preloaded from a host device onto the main memory coupled to the IC device. A utility test program is loaded onto the local memory of the IC device. The management controller executes the utility test program to load the test content from the main memory onto the local memory. The test content is applied to perform scan testing of one or more functional circuit blocks while maintaining functional connectivity of the IC device with the host device.

20 Claims, 8 Drawing Sheets

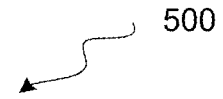

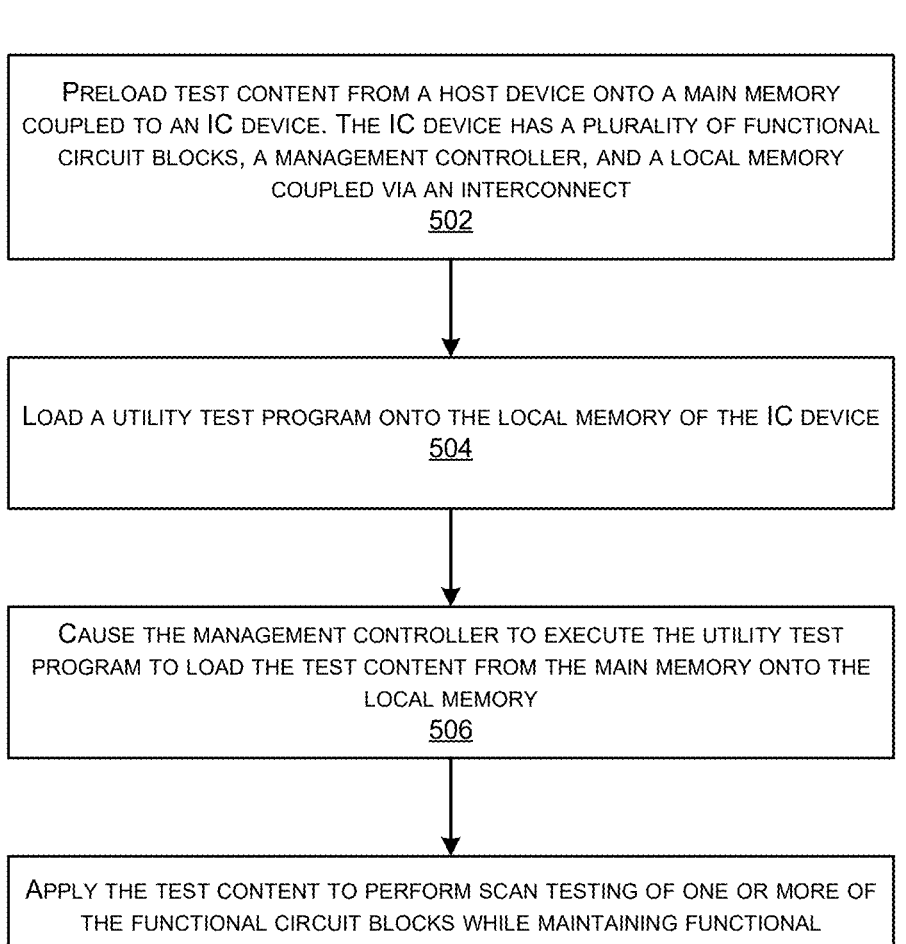

PRELOAD TEST CONTENT FROM A HOST DEVICE ONTO A MAIN MEMORY COUPLED TO AN IC DEVICE. THE IC DEVICE HAS A PLURALITY OF FUNCTIONAL CIRCUIT BLOCKS, A MANAGEMENT CONTROLLER, AND A LOCAL MEMORY COUPLED VIA AN INTERCONNECT
502

LOAD A UTILITY TEST PROGRAM ONTO THE LOCAL MEMORY OF THE IC DEVICE
504

CAUSE THE MANAGEMENT CONTROLLER TO EXECUTE THE UTILITY TEST PROGRAM TO LOAD THE TEST CONTENT FROM THE MAIN MEMORY ONTO THE LOCAL MEMORY
506

APPLY THE TEST CONTENT TO PERFORM SCAN TESTING OF ONE OR MORE OF THE FUNCTIONAL CIRCUIT BLOCKS WHILE MAINTAINING FUNCTIONAL CONNECTIVITY WITH THE HOST DEVICE
508

FIG. 5

IN-SITU SCAN TESTING OF AN INTEGRATED CIRCUIT DEVICE

BACKGROUND

Some integrated circuit (IC) devices, such as, processors, accelerators, graphics processing units (GPUs), etc., may be tested during device manufacturing using automatic test program generation (ATPG) based test methods. For example, the IC devices may be designed for testability by embedding scan test logic to support testing each functional circuit block using a scan interface and a joint test action group (JTAG) interface. Generally, ATPG based testing may be performed by configuring the IC device in an ATPG scan mode using the JTAG interface, and configuring some of the input/output (I/O) pins of the IC device as the scan interface for test stimulus delivery and checking the device response. For example, the scan interface may be used to drive test stimulus from an automatic test equipment (ATE) through one or more input pins, and the test response may be delivered on one or more output pins, which can be compared with an expected response by the ATE to detect any potential faults in the IC device.

BRIEF DESCRIPTION OF THE DRAWINGS

Various embodiments in accordance with the present disclosure will be described with reference to the drawings, in which:

FIG. 5 illustrates an example flowchart for a method to perform in-situ scan testing of an IC device that is coupled to a main memory, in accordance with some embodiments;

DETAILED DESCRIPTION

Figure 1:
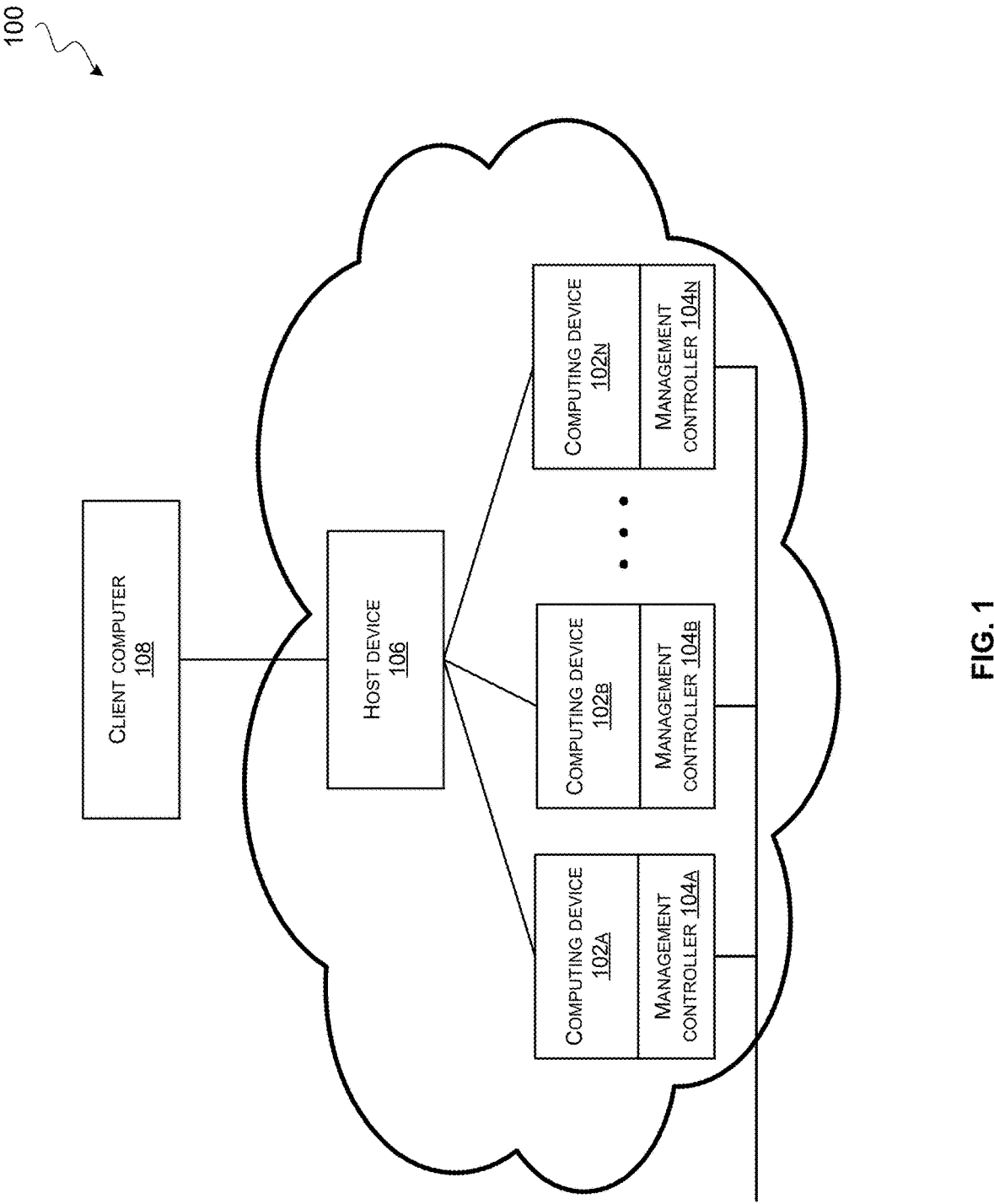
FIG. 1 illustrates an example of a system that can be used to execute user workloads on computing devices.

Some integrated circuit (IC) devices may be part of a server computer that provides cloud services, and may be used to execute user workloads for different applications, e.g., artificial intelligence, machine learning, high performance computing, gaming, multi-media processing, etc. The IC devices may include a plurality of functional circuit blocks, such as, processor cores, accelerator cores, microcontrollers, direct memory access (DMA) controllers, memory controllers, and high-speed functional I/O interfaces (e.g., PCIe, USB, etc.), among others, which may communicate with each other using one or more interconnects. Some of the functional circuit blocks may be dense (e.g., large gate count) based on the functionality, and can be more prone to faults. Generally, ATPG based scan testing may be performed during debugging and device manufacturing to detect faults so that appropriate corrective measures can be taken before the IC device is deployed.

IC devices that are designed for testability may include additional logic to support ATPG based scan testing that can be performed by connecting a testing device (e.g., an automatic test equipment (ATE)) to the IC device. In most implementations, ATPG based scan testing may be performed by configuring the IC device into a scan test mode using the JTAG interface, and configuring some of the external pins of the IC device into test inputs for test stimulus delivery and test outputs for checking the device response. For example, the external pins may include general purpose input output (GPIO) pins, or memory interface pins of the IC device. However, once the IC device has been tested and is placed in a computer, a server, or an expansion card for deployment into a field operating environment (such as a data center, an industrial setting, or another environment where the IC device is used to produce applicable results), access to the input/output (I/O) pins to perform the scan testing of the IC device may be unavailable, and those I/O pins may be reconfigured to support another function. Furthermore, connecting an ATE to those I/O pins to supply the test stimulus and check the response may not be feasible in the field.

In some implementations, the IC device may be connected to a host device in a host system, and a network connection of the host device can be used to deliver the test stimulus to the IC device in the field. The IC device can be configured into a partial scan test mode without impacting the operation of the other functional circuit blocks, and the test response can be checked internally by the IC device. For example, an external microcontroller coupled to the IC device that is generally used to monitor the health of the IC device can be repurposed to deliver the test content. However, testing large IC devices having multiple functional circuit blocks with dense logic may require a huge amount of test content (e.g., close to 100 GB). In some implementations, the test content may be delivered to the IC device in multiple batches due to limited memory capacity (e.g., 500 MB) of the external microcontroller to store the test content. Thus, performing in-situ scan testing of the IC device may take a long time causing the IC device to be taken out of service for an extended period of time, and impacting the availability of the IC device for execution of the user workloads.

Techniques described herein can be used to perform in-situ scan testing of the IC device by utilizing the main memory of the IC device to load the test content using the functional interfaces of the IC device that are connected to the host device. In some embodiments, the test content, and a utility test program to perform the scan testing of the IC device may be loaded onto the host device as a user workload. The host device may treat the user workload as a normal workload, and preload the test content onto the main memory of the IC device under test. The test content may include a test configuration file, and multiple vector sets that each includes a test stimuli vector, an expected result vector, and a mask vector. The utility test program may be executed by an embedded management controller of the IC device to configure a functional circuit block of the IC device in a scan test mode, apply a test stimulus vector using a scan testing interface, receive a response vector using the scan testing interface, and generate a test result vector based on the mask vector. The test result vector may be compared with the expected result vector to detect a fault in the IC device. The test result vector can be written to the main memory of the IC device under test for logging purposes. At the end of the test, the host device may access the main memory of the IC device to examine the test result. Note that the utility test program may be executed by any functional circuit block of the IC device that is not being tested, and is capable of performing certain write and read operations.

In some implementations, the functional circuit blocks of the IC device may be coupled to an interconnect via a respective interconnect interface. However, when a functional circuit block of the IC device is configured to be in the scan test mode, the functional circuit block may output unexpected data to the corresponding interconnect interface, which can interfere with the operation of the rest of the IC device. In some embodiments, output of the functional circuit block under test may be masked using a mask configuration bit provided by a block mask register to isolate the functional circuit block under test from interfering with the operation of the IC device to maintain the functional connectivity with the host device.

Techniques described herein can accelerate the testing process significantly by utilizing the main memory of the host system (e.g., device memory) to store the large amounts of test content, and the functional interfaces of the IC device to deliver the test content to the functional circuit blocks under test while maintaining the functional connectivity with the host device. Thus, faults in the IC device can be detected in a timely manner, and appropriate actions may be taken to resolve the issues quickly to minimize the downtime of the host system. In some cases, preemptive actions may be taken to maintain the health of the IC devices. For example, minimum operating voltage levels of the IC device can be tracked over time to determine whether a particular circuit block, or the whole IC device needs to be replaced preemptively before it becomes faulty, since some IC devices may demand a higher power supply voltage to operate at their maximum specified speed as they age.

In the following description, various examples will be described. For purposes of explanation, specific configurations and details are set forth in order to provide a thorough understanding of the examples. However, it will also be apparent to one skilled in the art that the example may be practiced without the specific details. Furthermore, well-known features may be omitted or simplified in order not to obscure the embodiments being described.

FIG. 1 illustrates an example of a system 100 that can be used to execute user workloads on computing devices.

The system 100 may include a host device 106 coupled to a plurality of computing devices including a computing device 102a, a computing device 102b, and a computing device 102n. Each of the N computing devices 102a-102n may include a CPU, a processor, an accelerator, a graphics processing unit (GPU), or any suitable integrated circuit (IC) device comprising multiple computing cores or dense (e.g., high gate count) functional circuit blocks. The host device 106 may also be coupled to a client computer 108. In some examples, the host device 106 may be configured to execute user workloads for a cloud service provider for different applications in high performance computing, machine learning, artificial intelligence, gaming, multi-media processing, web searching, etc. For example, the client computer 108 may communicate with the host device 106 over a network to load necessary files for executing a user workload. As an example, the client computer 108 may execute a neural network model on the host device 106 for a machine learning application.

Each of the N computing devices 102a-102n may include corresponding N management controllers including a management controller 104a, a management controller 104b, and a management controller 104n. Each of the N management controllers 104a-104n may include a general-purpose microcontroller that may be loaded with firmware to perform certain utility operations. For example, in a normal operating mode, each of the N management controllers 104a-104n may be used to track the health of the corresponding computing device, e.g., by monitoring voltages, temperatures, etc., over time. Each of the N management controllers 104a-104n may include a network connection to communicate with a remote device for sending reports or logs, or other suitable information.

In some cases, each of the computing devices 102a-102n may include scan test logic to support design for testability. As an example, each of the N computing devices 102a-102n may include a JTAG interface to configure the computing device in a scan test mode using an external testing device connected to the computing device, which can enable testing different functional circuit blocks of the computing device using corresponding embedded scan test logic. In some examples, one or more external pins of the computing device, e.g., general-purpose input output (GPIO) pins, and/or other functional pins (e.g., memory interface pins) can be used to supply automatic test pattern generator (ATPG) based test stimulus to the functional block under test, and shift out a test response from the computing device. The external testing device may compare the test response with an expected response to identify potential faults in the computing device.

Generally, ATPG based scan testing may be performed during the device manufacturing process before the computing device is inserted into a server computer or a host system and deployed. The external pins used for the ATPG based scan testing prior to deployment may be reconfigured for other functions related to the normal operating mode. Furthermore, once the computing device has been deployed, the external testing device may not be available in the field to configure the computing device in the scan test mode and perform the testing.

In some implementations, the network connection of the management controller 104a-104n may be used to push the test content onto the management controller 104a-104n via a slow interface. However, the test content may be enormous in size (e.g., several GBs or more). Thus, it may take a long time to test the computing device 102a-102n, and may not be the most efficient way to find faults in the computing device.

It may be desirable to have the ability to perform in-situ (e.g., in the field) scan testing of each of the N computing devices 102a-102n, e.g., to monitor health of the computing device over time, or when any of the computing devices 102a-102n becomes faulty, to minimize the downtime of the system 100. In most cases, the computing devices 102a-102n may include embedded scan test logic that may have been used to perform ATPG based testing of the computing device prior to deployment. For example, each of the N computing devices 102a-102n may include a plurality of functional circuit blocks, and most of the functional circuit blocks that are prone to faults may include corresponding scan test logic that can enable testing of that functional circuit block to detect potential faults. The corresponding scan test logic can be connected to a scan bus to be part of a scan chain that operates as a long shift register. An internal test path can be used to shift in the test stimulus onto the scan chain, and shift out the test response for detecting faults.

Techniques described herein can be used to utilize the existing memory resources of the computing device for loading the test content that can be accessed using the functional interfaces of the computing device with the host device to perform ATPG based scan testing of one or more functional circuit blocks of the computing device. This is described with reference to FIG. 2.

Figure 2:
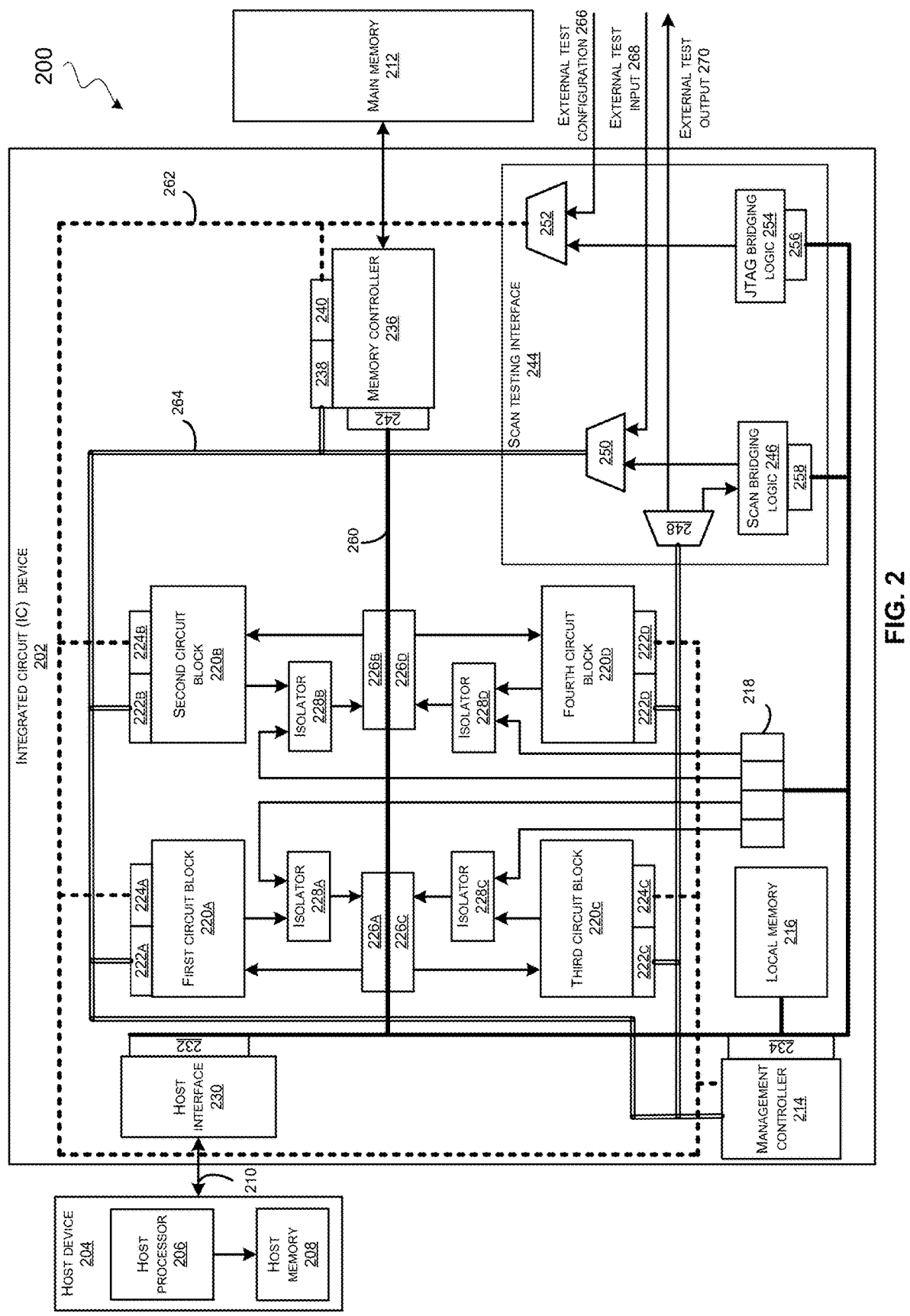
FIG. 2 illustrates an example of a system that can be used to perform in-situ scan testing of an IC device, in accordance with some embodiments.

FIG. 2 illustrates an example of a system 200 that can be used to perform in-situ scan testing of an IC device 202, in accordance with some embodiments. The IC device 202 can be an accelerator device, a GPU, a processor, or any suitable computing device having a plurality of functional circuit blocks. As an example, the IC device 202 can be one of the N computing devices 102a-102n in FIG. 1.

The IC device 202 may include a plurality of functional circuit blocks comprising a first circuit block 220a, a second circuit block 220b, a third circuit block 220c, a fourth circuit block 220d, a management controller 214, a scan testing interface 244, a host interface 230, and a memory controller 236, and a local memory 216, that may each be connected to an interconnect 260. In various examples, each of the circuit blocks 220a-220d may include a processor core, a GPU core, an accelerator core, or any computing core that may include dense logic (e.g., high number of logic gates), which can make it more prone to faults. The first circuit block 220a may be connected to the interconnect 260 via an interconnect interface 226a, the second circuit block 220b may be connected to the interconnect 260 via an interconnect interface 226b, the third circuit block 220c may be connected to the interconnect 260 via an interconnect interface 226c, and the fourth circuit block 220d may be connected to the interconnect 260 via an interconnect interface 226d. As an example, the interconnect 260 may be an Advanced eXtensible interface (AXI) bus, and each of the interconnect interfaces may include a master and a slave interface. The IC device 202 may include additional or different circuit blocks (e.g., IO controllers, DMA engine, etc.) and/or interconnects (e.g., universal serial bus (USB), advanced peripheral bus (APB), etc.) based on the specification, without deviating from the scope of the disclosure.

The system 200 may include a host device 204 coupled to the IC device 202 via a high speed bus 210. As an example, the host device 204 may be the host device 106 in FIG. 1. The host device 204 may include a host processor 206 coupled to a host memory 208. The host processor 206 may be operable to execute software to enable execution of a user workload on the IC device 202. The host device 204 may be further operable to communicate with the IC device 202 using the host interface 230. For example, the high-speed bus 210 may be a peripheral component interconnect express (PCIe) bus, and the host interface 230 may include a PCIe controller. The host interface 230 may be coupled to the interconnect 260 via an interconnect interface 232 to allow the host device 204 access to other blocks of the IC device 202 via the interconnect 260.

The system 200 may also include a main memory 212 that may be accessed using the memory controller 236. The main memory 212 may be used to store data associated with the user workloads. The main memory 212 may include a high bandwidth memory (HBM) implemented using DDR SDRAM, or another suitable memory type based on the implementation, and may have a much larger storage capacity than the local memory 216. For example, the local memory 216 may include an SRAM, a register file, etc. The memory controller 236 may be connected to the interconnect 260 via an interconnect interface 242.

The IC device 202 may also include a management controller 214 operable to execute firmware to perform certain utility operations. The management controller 214 is an embedded controller coupled to the interconnect 260 via an interconnect interface 234. In the normal operating mode, the management controller 214 may be operable to monitor health of the IC device 202, e.g., by monitoring temperature and voltage levels on the IC device 202. In some embodiments, test program code may be loaded onto the management controller 214, and the management controller 214 may be invoked to execute the test program code to enable performing the in-situ scan testing of the IC device 202.

The IC device 202 may include embedded scan test logic to support scan testing of some or all of the circuit blocks during manufacturing and/or prior to deployment of the IC device 202. In some embodiments, a respective scan controller and a JTAG interface may be coupled to each circuit block of the IC device 202 that needs to be tested using scan testing. For example, each JTAG interface may be operable to configure a corresponding circuit block into a scan test mode according to a test configuration that can be applied via a JTAG bus 262. Each scan controller may be operable to apply a test stimulus vector to the corresponding circuit block and obtain a response vector via a scan bus 264 connected to each scan controller.

As shown in FIG. 2, a scan controller 222a and a JTAG interface 224a may be coupled to the first circuit block 220a, a scan controller 222b and a JTAG interface 224b may be coupled to the second circuit block 220b, a scan controller 222c and a JTAG interface 224c may be coupled to the third circuit block 220c, and a scan controller 222d and a JTAG interface 224d may be coupled to the fourth circuit block 220d. A scan controller 238 and a JTAG interface 240 may be coupled to the memory controller 236. Note that scan test logic may also be embedded in other blocks of the IC device 202 (e.g., the host interface 230, management controller 214, interconnect interfaces 226a-226d, etc.), but is not shown in FIG. 2 for ease of illustration.

The IC device 202 may include a scan testing interface 244 to enable scan testing of the one or more functional circuit blocks of the IC device 202. The scan testing interface 244 may be coupled to an internal test path that accesses the local memory 216, and an external test path that accesses external pins of the IC device 202. For example, prior to deployment, ATPG based scan testing may be performed to provide an external test configuration 266 and an external test input 268 on the external test pins by the testing device. A multiplexer 252 may select an external test path to drive the external test configuration 266 to the JTAG interface of a circuit block to be tested via the JTAG bus 262 to configure that circuit block in a scan test mode. A multiplexer 250 may select the external test path to drive an external test input 268 via the scan bus 264 to the scan controller of the circuit block under test to apply the external test input 268 to the circuit block under test. A de-multiplexer 248 may select the external test path to drive a test response obtained via the scan bus 264 from the scan controller of the circuit block under test as an external test output 270 on one or more external pins of the IC device 202. However, when the IC device 202 has been deployed in a field operating environment, the external test path may not be available for use in the field.

In some embodiments, the system 200 may be used to perform in-situ scan testing of the IC device 202 in the field operating environment by configuring the scan testing interface 244 to select the internal test path to apply test content stored in the local memory 216 for scan testing. For example, memory resources available to the IC device 202 may be utilized to load the test content into the IC device 202, when the system 200 is in idle state, e.g., not running any normal user workloads. The scan testing interface 244 may include a scan bridging logic 246 and a JTAG bridging logic 254 to store a portion of the test content to be applied to the circuit block under test. The scan bridging logic 246 may be coupled to the interconnect 260 via an interconnect interface 258, and the JTAG bridging logic 254 may be coupled to the interconnect 260 via an interconnect interface 256. The test content may include a test configuration, one or more test stimulus vectors, and one or more mask vectors.

As an example, the JTAG bridging logic 254 may store a test configuration (e.g., in a JTAG FIFO) that can be selected using the multiplexer 252 to drive the test configuration to the JTAG interface of the circuit block under test via the JTAG bus 262 that can configure that circuit block under test in a scan test mode. The JTAG bridging logic 254 may also provide necessary data formatting between the interconnect interface 258 and the JTAG bus 262 based on the bus protocol used by the interconnect interface 258. Similarly, the scan bridging logic 246 may store the one or more test stimulus vectors (e.g., in a scan FIFO) that can be selected using the multiplexer 250 to drive the one or more test stimulus vectors to the scan controller of the circuit block under test via the scan bus 264 to apply the one or more test stimulus vectors to the circuit block under test. Additionally, the scan bridging logic 246 may also store in the scan FIFO one or more response vectors obtained from the scan controller of the circuit block under test via the scan bus 264 using the de-multiplexer 248. The scan bridging logic 246 may also provide necessary data formatting between the interconnect interface 258 and the scan bus 264 based on the bus protocol used by the interconnect interface 258.

When the circuit block under test is in the scan test mode, outputs of the circuit block under test connected to the interconnect 260 via the respective interconnect interface may provide unexpected data, which can interfere with the operation of the IC device 202. In some embodiments, the outputs of the circuit block under test may be blocked to communicate with the interconnect 260 so that the functional connectivity with the host device 204 can be maintained without the host device 204 being aware of the scan testing being executed on the IC device 202. For example, the IC device 202 may include a block mask register 218 that includes a respective mask configuration bit for each functional circuit block of the IC device 202 that includes embedded scan test logic. The outputs of each functional circuit block may be gated by the respective mask configuration bit from the block mask register 218 using a respective isolator circuit. FIG. 2 shows the block mask register 218 having 4 mask configuration bits for corresponding circuit blocks 220a-220d that each can be set to mask the output from the corresponding circuit block 220a-220d; however, the block mask register 218 may include more or fewer number of bits based on the implementation and the number of functional circuit blocks that need to be isolated.

Each isolator circuit may be operable to mask the outputs from the corresponding functional circuit block under test to the interconnect 260. For example, an isolator circuit 228a may be used to mask the outputs from the first circuit block 220a to the interconnect interface 226a based on setting a corresponding mask configuration bit from the block mask register 218, an isolator circuit 228b may be used to mask the outputs from the second circuit block 220b to the interconnect interface 226b based on setting a corresponding mask configuration bit from the block mask register 218, an isolator circuit 228c may be used to mask the outputs from the third circuit block 220c to the interconnect interface 226c based on setting a corresponding mask configuration bit from the block mask register 218, and an isolator circuit 228a may be used to mask the outputs from the fourth circuit block 220d to the interconnect interface 226d based on setting a corresponding mask configuration bit from the block mask register 218. The isolator circuit may be implemented using an AND gate, a NOR gate, or another suitable gating logic to mask the outputs from the corresponding circuit block.

In some embodiments, block test program code for testing one or more functions circuit blocks of the IC device 202 may be loaded onto the host device 204 (e.g., in the host memory 208) via a network connection to perform in-situ scan testing of the IC device 202, e.g., when the host device 204 is not being used to execute a normal user workload. The block test program code may include utility program code for loading onto the management microcontroller 214, and test content that includes a test configuration file and multiple vector sets comprising a plurality of test stimuli vectors, expected response vectors, and mask vectors. The host device 204 may be operable to preload the test content as a user workload onto the main memory 212.

In some implementations, executing the block test program code on the host processor 206 may preload the test content onto the main memory 212 using the host interface 230 and the memory controller 236 via the interconnect 260. The host device 204 may be further operable to load the utility program code onto the local memory 216 via the interconnect 260 using the host interface 230. The host device 204 may be further operable to cause the management controller 214 to execute the utility program code by asserting a program execution signal to the management microcontroller 214 to initiate the in-situ scan testing of the IC device 202. This is further described with reference to FIG. 3.

Figure 3:
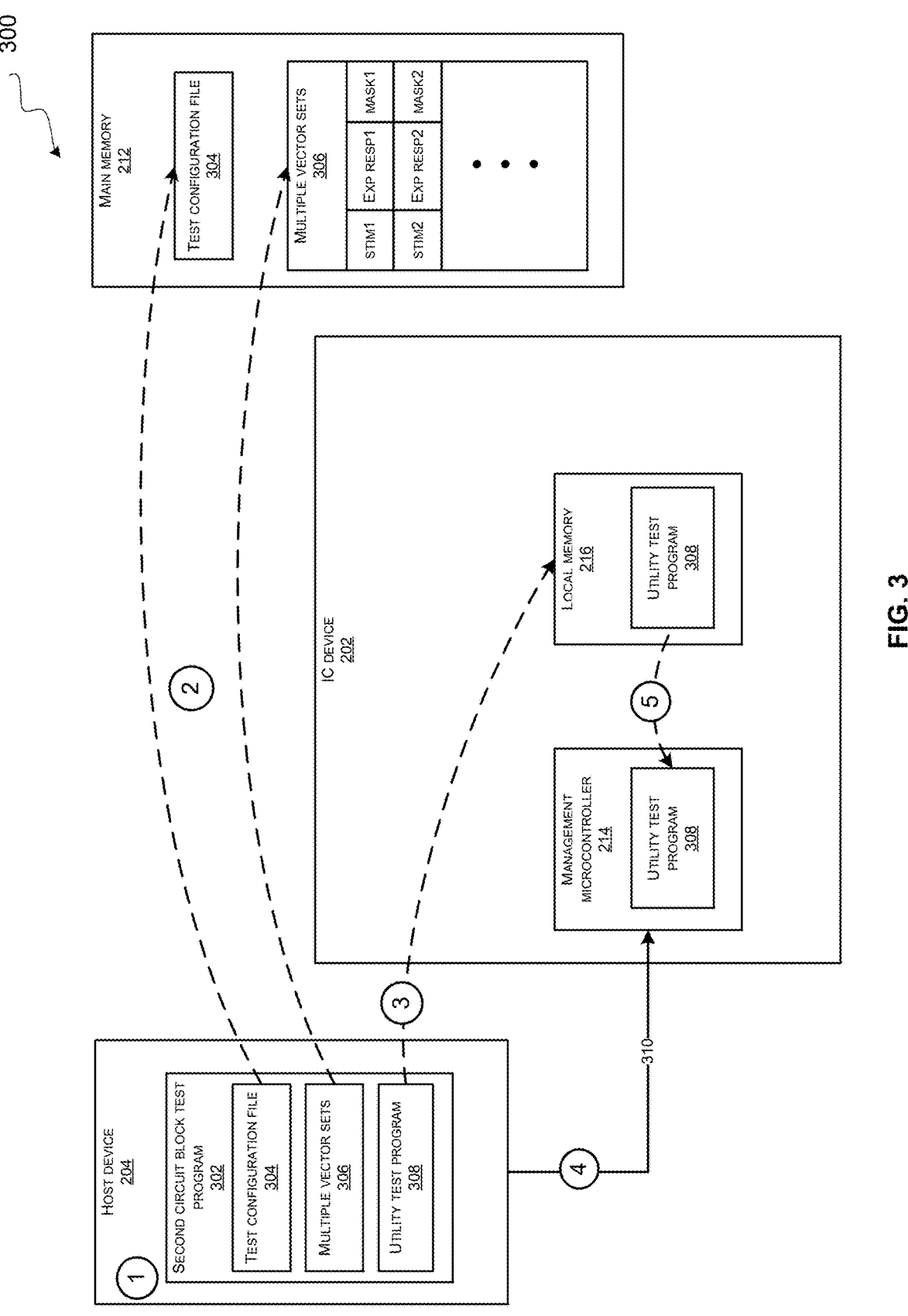
FIG. 3 illustrates an example sequence of steps to perform in-situ scan testing of a circuit block of the IC device, in accordance with some embodiments.

FIG. 3 illustrates an example sequence of steps 300 to perform in-situ scan testing of a circuit block of the IC device 202, in accordance with some embodiments. As an example, the functional circuit block to be tested is the second circuit block 220b in FIG. 2. Note that FIG. 3 illustrates only certain components of the system 200 described with reference to FIG. 2, for ease of illustration.

In some instances, the host system 100 may be taken offline to perform the in-situ scan testing of the IC device 202 in a field operating environment, when none of the normal user workloads are being executed. In step 1, a second circuit block test program 302 may be loaded onto the host device 204 that includes a user workload to perform the scan testing of the second circuit block 220b. For example, the second circuit block test program 302 may include a test configuration file 304, multiple vector sets 306, and a utility test program 308. The test configuration file 304 and the multiple vector sets 306 may correspond to the test content that can be applied to the second circuit block 220b to perform the in-situ scan testing.

In step 2, the host device 204 may preload the test content as a user workload onto the main memory 212. For example, the test content may include the test configuration file 304, and the multiple vector sets 306. The multiple vector sets 306 may each include a test stimuli vector, an expected result vector, and a mask vector. As an example, the multiple vector sets may include a first vector set comprising a test stimuli vector "stim1", an expected result vector "exp resp1", and a mask vector "mask1", a second vector set comprising a test stimuli vector "stim2", an expected result vector "exp resp2", and a mask vector "mask2", and so on.

In step 3, the host device 204 may load the utility test program 308 onto the local memory 216. Referring back to FIG. 2, the host device 204 may load the utility test program 308 using the host interface 230 onto the local memory 216 via the interconnect 260.

In step 4, the host device 204 may assert a program execution signal 310 to the management microcontroller 214 indicating to initiate the in-situ scan testing of the second circuit block 220b.

In step 5, the program execution signal 310 may cause the management controller 214 to fetch the utility test program 308 from the local memory 216. The management micro-controller 214 may execute the utility test program 308 to perform certain operations to initiate the in-situ scan testing of the second circuit block 220b. Referring back to FIG. 2, in some embodiments, execution of the utility test program 308 may include isolating the second circuit block 220b by masking output from the second circuit block 220b to the interconnect 260 by setting a corresponding mask configuration bit in the block mask register 218 for the second circuit block 220b. For example, the output from the second circuit block 220b may be gated with the corresponding mask configuration bit of the block mask register 218 using the isolator circuit 228b to block the interconnect interface 226b from communicating with the interconnect 260 and interfering with the operation of the IC device 202.

In some embodiments, execution of the utility test program 308 may further include configuring the scan testing interface 244 to select the internal test path that accesses the local memory 216. As described previously, select signals to the multiplexors 250 and 252 may be configured to select the test content from the scan bridging logic 246 and the JTAG bridging logic 254 instead of the test content provided by the external pins of the IC device 202 via the external test path. Similarly, the select signal to the de-multiplexer 248 may be configured to provide the test response received on the scan bus 264 to be stored in the scan bridging logic 246 instead of driving it to one or more external pins as the external test output 270.

In some embodiments, execution of the utility test program 308 may further include transferring the test configuration file 304 from the main memory 212 to the local memory 216. For example, the utility test program 308 may include setting up DMA descriptors to transfer the test configuration file 304 from the main memory 212 to the local memory 216 using a DMA engine (not shown in FIG. 2). Execution of the utility test program 308 may further include reading the test configuration file 304 from the local memory 216 and writing to the JTAG bridging logic 254 via the interconnect interface 256. Since the scan testing interface 244 has been configured to select the internal test path that accesses the local memory 216, the JTAG bridging logic 254 may provide the test configuration based on the test configuration file 304, which will be driven on the JTAG bus 262 to the JTAG interface 224b coupled to the second circuit block 220b. The JTAG interface 224b may configure the second circuit block 220b into the scan test mode according to the test configuration. Once, the second circuit block 220b is in the scan test mode, the second circuit block 220b may be ready to accept test stimulus via the scan bus 264. This is further described with reference to FIG. 4.

Figure 4:
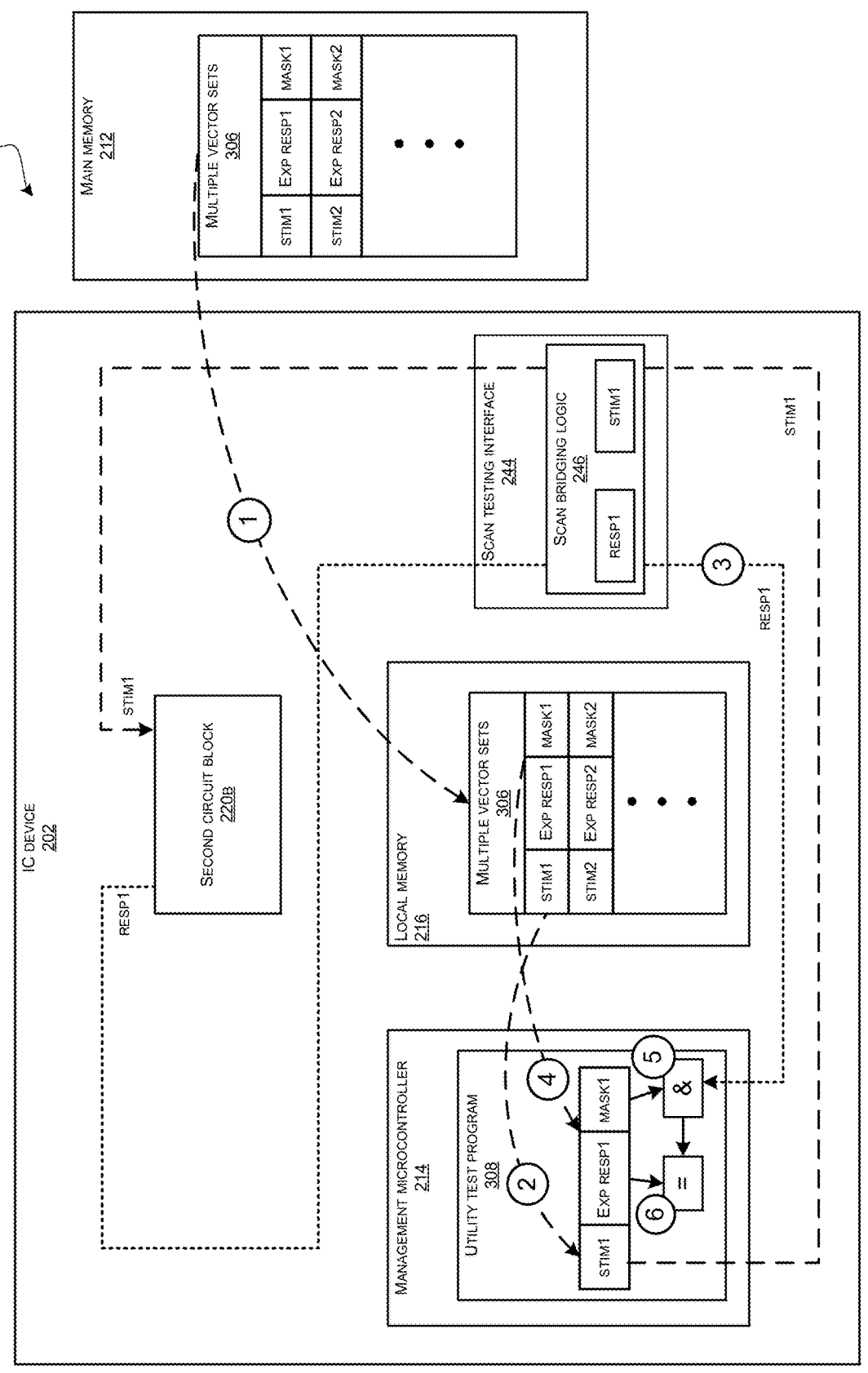
FIG. 4 illustrates an example sequence of steps to apply test stimulus to a circuit block under test of the IC device as part of the in-situ scan testing of the circuit block, in accordance with some embodiments.

FIG. 4 illustrates an example sequence of steps 400 to apply test stimulus to a circuit block under test of the IC device 202 as part of the in-situ scan testing of the circuit block, in accordance with some embodiments. For example, the circuit block under test is the second circuit block 220b. The sequence of steps 400 may be performed after the sequence of steps 300 has been performed and the second circuit block 220b is in the scan test mode. Note that FIG.

4 illustrates only certain components of the system 200 described with reference to FIG. 2, for ease of illustration.

In some embodiments, execution of the utility test program 308 by the management controller 314 may include applying the test content to the second circuit block 220b to perform the in-situ scan testing of the second circuit block 220b. As shown in FIG. 4 for step 1, the multiple vector sets 306 may be loaded from the main memory 212 into the local memory 216. In some implementations, the multiple vector sets 306 may be loaded into the local memory 216 in a piecemeal manner. For example, one or more vector sets from the multiple vector sets 306 may be read by management controller 214 from the main memory 212 via the memory controller 236, and written to the local memory 216 via the interconnect 260. In some implementations, the utility test program 308 may include setting up DMA descriptors to transfer the one or more vector sets of the multiple vector sets 306 from the main memory 212 to the local memory 216 using the DMA engine.

In step 2, execution of the utility test program 308 may include reading the test stimulus vector "stim1" from the local memory 216 and providing to the scan testing interface 244 to apply the "stim1" to the second circuit block 220b. For example, the management controller 314 may read the "stim1" from the local memory 216 and write the "stim1" to the scan bridging logic 246. Referring back to FIG. 2, the multiplexer 250 may be configured to select the internal test path to drive the "stim1" on the scan bus 264. The scan controller 222b may apply the "stim1" to the second circuit block 220b in the scan test mode. The scan controller 222b may obtain a response vector "resp1" from the second circuit block 220b and provide to the scan bridging logic 246 via the de-multiplexer 248.

Referring back to FIG. 4, in step 3, execution of the utility test program 308 by the management controller 314 may include reading the response vector "resp1" from the scan bridging logic 246 via the interconnect 260.

In step 4, execution of the utility test program 308 by the management controller 314 may include reading the corresponding expected result vector "exp resp1", and the mask vector "mask1" from the local memory 306.

In step 5, execution of the utility test program 308 by the management controller 314 may include applying the mask vector "mask1" to the response vector "resp1" to generate a test result vector. For example, a logical AND operation may be performed between the mask vector "mask1" and the response vector "resp1" to generate the test result vector.

In step 6, execution of the utility test program 308 by the management controller 314 may include comparing the test result vector with the expected result vector "exp resp1" to determine whether a fault is detected in the second circuit block 220b. For example, when the test result vector matches with the "exp resp1", it indicates a pass result, and when the test result vector does not match with the "exp resp1", it indicates a fail result.

Referring back to FIG. 2, execution of the utility test program 308 by the management controller 314 may include writing the test result vector to the main memory 212. In some embodiments, the management controller 314 may also write the pass/fail result and failure signature data in the memory device 212 corresponding to the "stim1". Steps 1 to 6 may be performed for each vector set of the multiple vector sets 306, and a corresponding test result vector, pass/fail result, and failure signature data may be written to the memory device 212 for each vector set. In some embodiments, the management controller 314 may write the test result vector, pass/fail result and the failure signature data corresponding to each vector set in place of the corresponding vector set in the main memory 212.

In some embodiments, the utility test program may provide an address that the management microcontroller 214 may write to via the host interface 230 to indicate test completion. For example, the address may be mapped to the host memory 208 or a register in the host device 204. The host device 204 may be operable to poll the address to determine when the in-situ scan testing is complete. In some embodiments, the management microcontroller 214 may also write to the address via the host interface 230 a location of the pass/fail result and the failure signature data in the memory device 212.

Thus, as described above, the main memory 212 may be used to store test content to perform in-situ scan testing of the IC device 202 in a field operating environment, which can accelerate the testing process significantly. Thus, faults in the circuit blocks can be detected in a timely manner so that appropriate actions may be taken to resolve the issue quickly before execution of the normal user workloads gets impacted. Using the corresponding isolator circuit 228a-228d to isolate the circuit block under test can ensure that the functional connectivity of the IC device 202 with the host device 204 is not impacted during the in-situ scan testing process, and the host device 204 is able to read the test logs from the main memory 212. In some examples, the management controller 214 may also track the minimum operating voltage levels of the IC device 202 over time to determine whether a particular core needs to be replaced before it becomes faulty. For example, some ICs may demand a higher power supply voltage to operate at their maximum specified speed as they age. Thus, monitoring the health and logic functionality of the IC device preemptively can help minimize the downtime of the host system 100.

Note that the utility test program 308 may be executed by any functional circuit block of the IC device 202 that is not being tested, e.g., any of the circuit blocks 220a-220d that is capable of performing write and read operations to access the local memory 216, the scan bridging logic 246, and the JTAG bridging logic 254, without deviating from the scope of the disclosure.

FIG. 5 illustrates an example flowchart 500 for a method to perform in-situ scan testing of an IC device that is coupled to a main memory, in accordance with some embodiments. The IC device may include a plurality of functional circuit blocks, a management controller, and a local memory coupled via an interconnect. For example, the IC device can be one of the computing devices 102a-102n, or the IC device 202.

In step 502, the method includes preloading test content from a host device onto the main memory coupled to the IC device. The test content may include a test configuration file, and multiple vector sets that each includes a test stimuli vector, an expected result vector, and a mask vector. For example, the host device 204 may execute the second circuit block test program 302 to preload the test content as a user workload onto the memory device 212. As described with reference to step 2 in FIG. 3, the test content may include the test configuration file 304 and the multiple vector sets 306, which may be loaded by the host device 204 to the main memory 212 using the host interface 230 and the memory controller 236 to perform the in-situ scan testing of the second circuit block 220b using the test content.

In step 504, the method includes loading a utility test program onto the local memory of the IC device. As described with reference to step 3 in FIG. 3, the utility test program 308 may be loaded by the host device 204 to the local memory 216 using the host interface 230 and the interconnect 260.

In step 506, the method includes causing the management controller to execute the utility test program to load the test content from the main memory onto the local memory. As described with reference to step 4 in FIG. 3, causing the management controller 314 may include asserting the program execution signal 310 to the management microcontroller 214 that may cause the management controller 314 to fetch the utility test program 308 from the local memory 216. The management microcontroller 214 may execute the utility test program 308 to initiate the in-situ scan testing of the IC device 202 by loading the test content from the main memory 212 onto the local memory 216, as described with reference to FIG. 4.

Referring back to FIG. 2, execution of the utility test program 308 may also include isolating the second circuit block 220b by masking outputs from the second circuit block 220b to the interconnect interface 226b coupled to the interconnect 260 by setting a corresponding mask configuration bit in the block mask register 218 for the second circuit block 220b. For example, the isolator circuit 228b may gate the outputs of the second circuit block 220b by the corresponding mask configuration bit of the block mask register 218 to block the interconnect interface 226b to interfere with the operation of the IC device 202.

Furthermore, execution of the utility test program 308 may also include configuring the scan testing interface 244 to select the internal test path that accesses the local memory 216. As described with reference to FIG. 2, configuring the scan testing interface 244 may include configuring the multiplexers 250 and 252, and the de-multiplexer 248 to select the internal test path via the scan bridging logic 246 and the JTAG bridging logic 254 connected to the local memory 216 via the interconnect 260.

In step 508, the method includes applying the test content to perform scan testing of the one or more functional circuit blocks while maintaining functional connectivity with the host device. As described with reference to FIGS. 2 and 3, applying the test content may include configuring the second circuit block 220b into a scan test mode according to the test configuration file 304. For example, the management microcontroller 214 may read the test configuration file 304 from the local memory 216 and write to the JTAG bridging logic 254 via the interconnect interface 256. Since the scan testing interface 244 has been configured to select the internal test path that accesses the local memory 216, the JTAG bridging logic 254 may provide the test configuration based on the test configuration file 304, which will be driven on the JTAG bus 262 to the JTAG interface 224b coupled to the second circuit block 220b. The JTAG interface 224b may configure the second circuit block 220b into the scan test mode according to the test configuration. Functional connectivity with the host device 204 may be maintained via the host interface 230 since the second circuit block 220b may be isolated from the interconnect 260 using the isolator circuit 228b during the scan testing process.

As described with reference to step 1 in FIG. 4, the multiple vector sets 306 may be loaded from the main memory 212 into the local memory 216 in a piecemeal manner. The management microcontroller 214 may apply the test content by providing the test stimulus vector "stim1" from the local memory 216 to the scan testing interface 244 as described with reference to step 2 in FIG. 4, and obtain the response vector "resp1" from the scan testing interface 244 as described with reference to step 3 in FIG. 4. The management microcontroller 214 may further apply the test content by applying the mask vector "mask1" to the response vector "resp1" to generate a test result vector, as described with reference to step 5 in FIG. 4. The management microcontroller 214 may further apply the test content by comparing the test result vector with the expected result vector "exp resp1" to determine whether a fault is detected, as described with reference to step 6 in FIG. 4.

The management microcontroller 214 may further apply the test content by writing the test result vector to the main memory 212 using the interconnect 260 and the memory controller 236. The management microcontroller 214 may further apply the test content by writing to a predetermined address via the host interface 230 to indicate test completion. The host device 204 may poll the predetermined address to determine when the in-situ scan testing is complete. The management microcontroller 214 may further apply the test content by writing to the predetermined address via the host interface 230 the location of the pass/fail result and failure signature data in the memory device 212.

Figure 6:
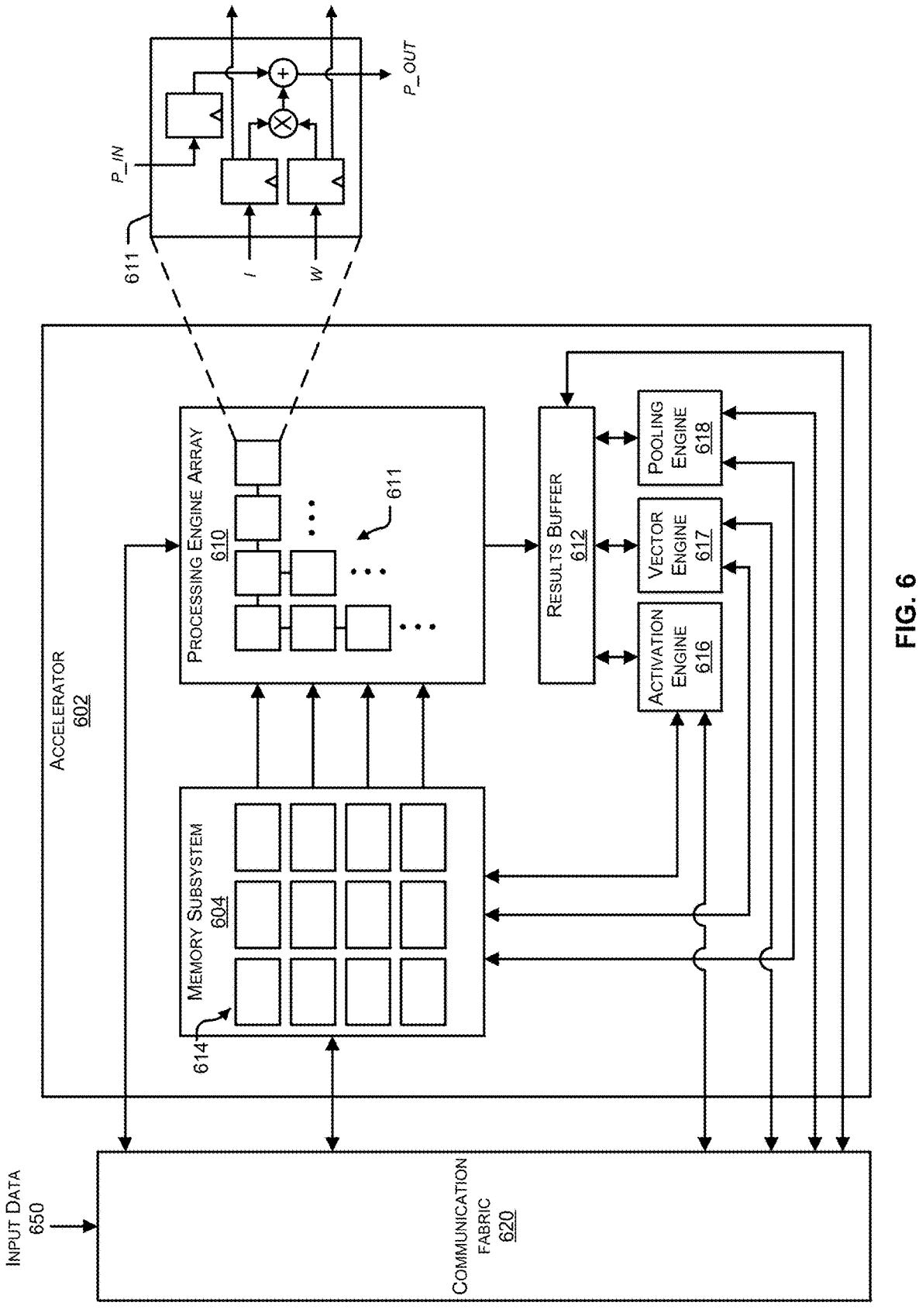
FIG. 6 illustrates a block diagram of an example of an integrated circuit device.

FIG. 6 is a block diagram illustrating an example of an integrated circuit device that can include an IC device 202 or a computing device 102a-102n. The example of FIG. 6 illustrates an accelerator 602. In various examples, the accelerator 602, for a set of input data (e.g., input data 650), can execute computations using a processing engine array 610, an activation engine 616, a vector engine 617, and/or a pooling engine 618. In some examples, the example accelerator 602 may be an integrated circuit component of a processor, such as a neural network processor. The processor may have other integrated circuit components, including additional accelerator engines.

In various implementations, the memory subsystem 604 can include multiple memory banks 614. As an example, the memory subsystem 604 can include the local memory 216. Memory subsystem 604 can also be referred to as a state buffer. In these implementations, each memory bank 614 can be independently accessible, meaning that the read of one memory bank is not dependent on the read of another memory bank. Similarly, writing to one memory bank does not affect or limit writing to a different memory bank. In some cases, each memory bank can be read and written at the same time. Various techniques can be used to have independently accessible memory banks 614. For example, each memory bank can be a physically separate memory component that has an address space that is separate and independent of the address spaces of each other memory bank. In this example, each memory bank may have at least one read channel and may have at least one separate write channel that can be used at the same time. In these examples, the memory subsystem 604 can permit simultaneous access to the read or write channels of multiple memory banks. As another example, the memory subsystem 604 can include arbitration logic such that arbitration between, for example, the outputs of multiple memory banks 614 can result in more than one memory bank's output being used. In these and other examples, though globally managed by the memory subsystem 604, each memory bank can be operated independently of any other.

Having the memory banks 614 be independently accessible can increase the efficiency of the accelerator 602. For example, values can be simultaneously read and provided to each row of the processing engine array 610, so that the entire processing engine array 610 can be in use in one clock cycle. As another example, the memory banks 614 can be read at the same time that results computed by the processing engine array 610 are written to the memory subsystem

604. In contrast, a single memory may be able to service only one read or write at a time. With a single memory, multiple clock cycles can be required, for example, to read input data for each row of the processing engine array 610 before the processing engine array 610 can be started.

In various implementations, the memory subsystem 604 can be configured to simultaneously service multiple clients, including the processing engine array 610, the activation engine 616, the vector engine 617, the pooling engine 618, and any external clients that access the memory subsystem 604 over a communication fabric 620. In some implementations, being able to service multiple clients can mean that the memory subsystem 604 has at least as many memory banks as there are clients. In some cases, each row of the processing engine array 610 can count as a separate client. In some cases, each column of the processing engine array 610 can output a result, such that each column can count as a separate write client. In some cases, output from the processing engine array 610 can be written into the memory banks 614 that can then subsequently provide input data for the processing engine array 610. As another example, the activation engine 616, the vector engine 617, and the pooling engine 618 can include multiple execution channels, each of which can be separate memory clients. The memory banks 614 can be implemented, for example, using static random access memory (SRAM). The communication fabric 620 can be an example of the interconnect 260, and the memory banks 604 can be an example of the local memory 216 in FIG. 2.

In various implementations, the memory subsystem 604 can include control logic. The control logic can, for example, keep track of the address spaces of each of the memory banks 614, identify memory banks 614 to read from or write to, and/or move data between the memory banks 614. In some implementations, memory banks 614 can be hardwired to particular clients. For example, a set of memory banks 614 can be hardwired to provide values to the rows of the processing engine array 610, with one memory bank servicing each row. As another example, a set of memory banks can be hard wired to receive values from columns of the processing engine array 610, with one memory bank receiving data for each column.

The processing engine array 610 is the computation matrix of the example accelerator 602. The processing engine array 610 can, for example, execute parallel integration, convolution, correlation, and/or matrix multiplication, among other things. The processing engine array 610 includes multiple processing engines 611, arranged in rows and columns, such that results output by one processing engine 611 can be input directly into another processing engine 611. Processing engines 611 that are not on the outside edges of the processing engine array 610 thus can receive data to operate on from other processing engines 611, rather than from the memory subsystem 604.

In various examples, the processing engine array 610 uses systolic execution, in which data arrives at each processing engine 611 from different directions at regular intervals. In some examples, input data can flow into the processing engine array 610 from the left and weight values can be loaded at the top. In some examples weights and input data can flow from the left and partial sums can flow from top to bottom. In these and other examples, a multiply-and-accumulate operation moves through the processing engine array 610 as a diagonal wave front, with data moving to the right and down across the array. Control signals can be input at the left at the same time as weights, and can flow across and down along with the computation.

In various implementations, the number of columns in the processing engine array 610 determines the computational capacity of the processing engine array 610, and the number of rows determines the required memory bandwidth for achieving maximum utilization of the processing engine array 610. The processing engine array 610 can have, for example, 64 columns and 128 rows, or some other number of columns and/or rows.

An example of a processing engine 611 is illustrated in FIG. 6 in an inset diagram. As illustrated by this example, a processing engine 611 can include a multiplier-accumulator circuit. Inputs from the left can include, for example, input data i and a weight value w, where the input data is a value taken from either a set of input data or a set of intermediate results, and the weight value is from a set of weight values that connect one layer of the neural network to the next. A set of input data can be, for example, an image being submitted for identification or object recognition, an audio clip being provided for speech recognition, a string of text for natural language processing or machine translation, or the current state of a game requiring analysis to determine a next move, among other things. In some examples, the input data and the weight value are output to the right, for input to the next processing engine 611.

In the illustrated example, an input from above can include a partial sum, p_in, provided either from another processing engine 611 or from a previous round of computation by the processing engine array 610. When starting a computation for a new set of input data, the top row of the processing engine array 610 can receive a fixed value for p_in, such as zero. As illustrated by this example, i and w are multiplied together and the result is summed with p_in to produce a new partial sum, p_out, which can be input into another processing engine 611. Various other implementations of the processing engine 611 are possible.

Outputs from the last row in the processing engine array 610 can be temporarily stored in the results buffer 612. The results can be intermediate results, which can be written to the memory banks 614 to be provided to the processing engine array 610 for additional computation. Alternatively, the results can be final results, which, once written to memory banks 614 can be read from the memory subsystem 604 over the communication fabric 620, to be output by the system.

In some implementations, the accelerator 602 includes an activation engine 616. In these implementations, the activation engine 616 can combine the results from the processing engine array 610 into one or more output activations. For example, for a convolutional neural network, convolutions from multiple channels can be summed to produce an output activation for a single channel. In other examples, accumulating results from one or more columns in the processing engine array 610 may be needed to produce an output activation for a single node in the neural network. In some examples, activation engine 616 can be bypassed.

In various examples, the activation engine 616 can include multiple separate execution channels. In these examples, the execution channels can correspond to the columns of the processing engine array 610, and can perform an operation on the outputs of a column, the result of which can be stored in the memory subsystem 604. In these examples, the activation engine 616 may be able to perform between 1 and n parallel computations, where n is equal to the number of columns in the processing engine array 610. In some cases, one or more of the computations can be performed simultaneously. Examples of computations that each execution channel can perform include exponentials, squares, square roots, identities, binary steps, bipolar steps, sigmoidals, and ramps, among other examples.

In some implementations, the accelerator 602 can include a pooling engine 618. Pooling is the combining of outputs of the columns of the processing engine array 610. Combining can include for example, computing a maximum value, a minimum value, an average value, a median value, a summation, a multiplication, or another logical or mathematical combination. In various examples, the pooling engine 618 can include multiple execution channels that can operating on values from corresponding columns of the processing engine array 610. In these examples, the pooling engine 618 may be able to perform between 1 and n parallel computations, where n is equal to the number of columns in the processing engine array 610. In various examples, execution channels of the pooling engine 618 can operate in parallel and/or simultaneously. In some examples, the pooling engine 618 can be bypassed.

In some implementations, the accelerator 602 can further include a vector engine 617. Vector engine 617 is a compute engine that can perform computations and manipulations on values stored in memory subsystem 604 and/or results buffer 612 such as values representing matrices of input values, weight values, intermediate results, etc. Vector engine 617 can include multiple execution channels each with a pipeline of computation circuit blocks (e.g., arithmetic logic units) to perform complex computations such as nested multiply-and-add operations and/or complex manipulations such as sorting operations. In various examples, execution channels of the vector engine 617 can operate in parallel and/or simultaneously. In some examples, the vector engine 617 can be bypassed or be omitted.

Herein, the activation engine 616, the vector engine 617, and the pooling engine 618 may be referred to collectively as execution engines. The processing engine array 610 is another example of an execution engine. Another example of an execution engine is a Direct Memory Access (DMA) engine, which may be located outside the accelerator 602.

Input data 650 can arrive over the communication fabric 620. The communication fabric 620 can connect the accelerator 602 to other components of a processor, such as a DMA engine that can obtain input data 650 from an Input/Output (I/O) device, a storage drive, or a network interface. The input data 650 can be, for example one-dimensional data, such as a character string or numerical sequence, or two-dimensional data, such as an array of pixel values for an image or frequency and amplitude values over time for an audio signal. In some examples, the input data 650 can be three-dimensional, as may be the case with, for example, the situational information used by a self-driving car or virtual reality data. In some implementations, the memory subsystem 604 can include a separate buffer for the input data 650. In some implementations, the input data 650 can be stored in the memory banks 614 when the accelerator 602 receives the input data 650.

In some examples, the accelerator 602 can implement a neural network processing engine. In these examples, the accelerator 602, for a set of input data 650, can execute a neural network to perform a task for which the neural network was trained. Executing a neural network on a set of input data can be referred to as inference or performing inference.

The weights for the neural network can be stored in the memory subsystem 604, along with input data 650 on which the neural network will operate. The neural network can also include instructions, which can program the processing engine array 610 to perform various computations on the weights and the input data. The instructions can also be stored in the memory subsystem 604, in the memory banks 614 or in a separate instruction buffer. The processing engine array 610 can output intermediate results, which represent the outputs of individual layers of the neural network. In some cases, the activation engine 616, the vector engine 617, and/or pooling engine 618 may be enabled for computations called for by certain layers of the neural network. The accelerator 602 can store the intermediate results in the memory subsystem 604 for inputting into the processing engine array 610 to compute results for the next layer of the neural network. The processing engine array 610 can further output final results from a last layer of the neural network. The final results can be stored in the memory subsystem 604 and then be copied out to host processor memory or to another location.

Figure 7:
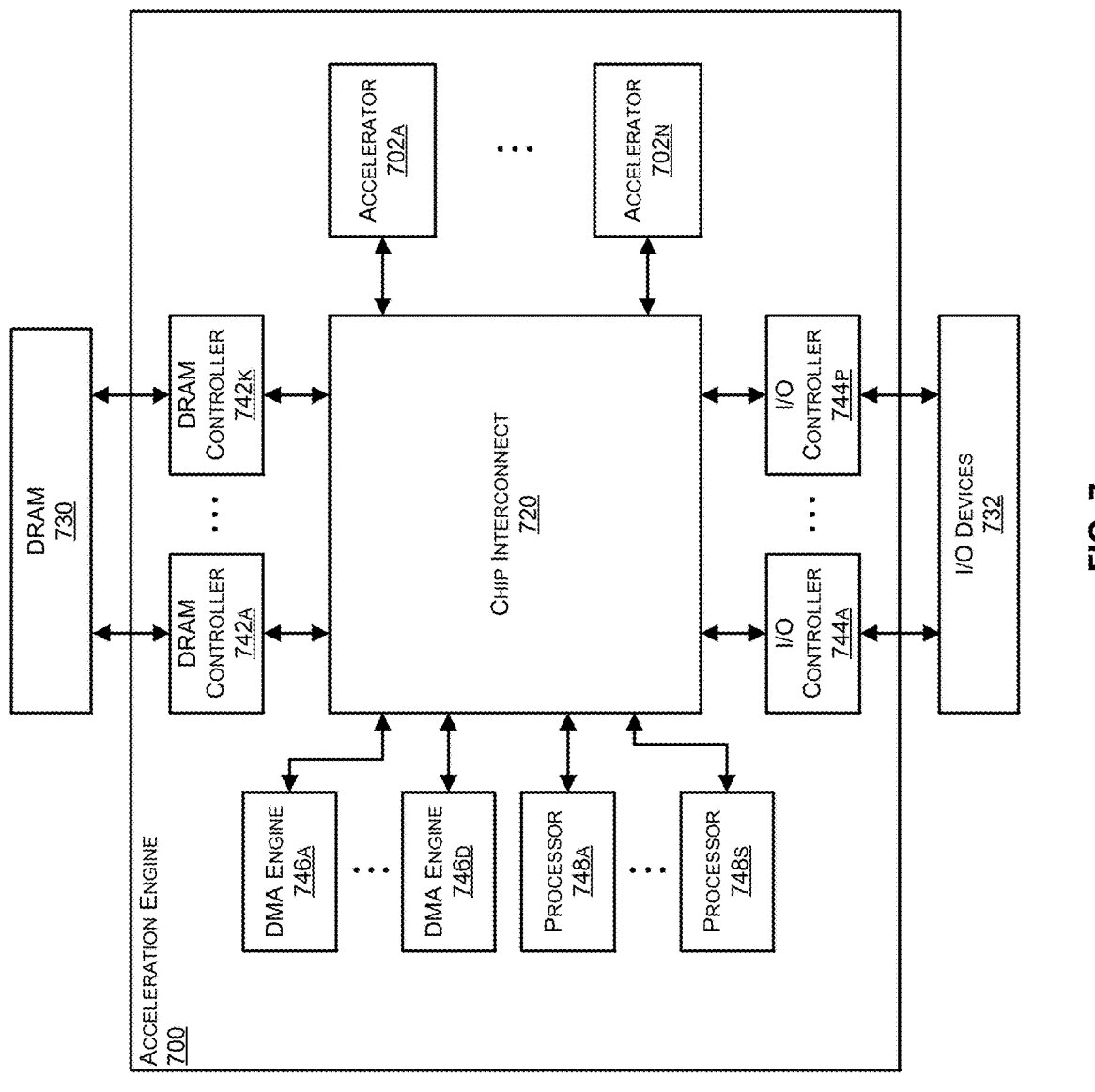
FIG. 7 illustrates a block diagram of an example of an acceleration engine.

FIG. 7 includes a block diagram that illustrates an example of an acceleration engine 700. The acceleration engine 700 is an example of an integrated circuit that can include one or more accelerators 702a-702n that may be similar to the accelerator illustrated in FIG. 6.

In the example of FIG. 7, the acceleration engine 700 includes multiple accelerators 702a-702n, each of which can perform a set of operations. In various examples, the accelerators 702a-702n are for particular types of operations, so that the accelerators 702a-702n can perform the operations much faster than when similar operations are performed by a general-purpose processor. In various examples, to perform a set of operations, input data on which the operations are to be performed must first be moved into the accelerators 702a-702n. Additionally, in some cases, program code is also moved into the accelerators 702a-702n, which programs the operations that the accelerators 702a-702n will perform on the data. In the illustrated example, the acceleration engine 700 includes n accelerators 702a-702n. Examples of accelerators that can be included in the acceleration engine 700 include graphics accelerators, floating point accelerators, neural network accelerators, and others. In various examples, the accelerators 702a-702n can each be the same (e.g., each of the is a graphics accelerator) or can be different (e.g., the accelerators 702a-702n include a graphics accelerator, a floating point accelerator, and neural network accelerator).

The example acceleration engine 700 further includes DRAM controllers 742a-742k for communicating with an external memory. The external memory is implemented, in this example, using DRAM 730. In the illustrated example, the acceleration engine 700 includes k DRAM controllers 742a-742k, each of which may be able to communicate with an independent set of banks of DRAM. In other examples, other types of RAM technology can be used for the external memory. The DRAM controllers 742a-742k can also be referred to as memory controllers.

In various examples, input data and/or program code for the accelerators 702a-702n can be stored in the DRAM 730. Different programs can cause the accelerators 702a-702n to perform different operations. For example, when one of the accelerators is a neural network accelerator, one program can configure the neural network accelerator to perform speech recognition while another program can configure the neural network accelerator to perform image recognition. In various examples, different accelerators 702a-702n can be programmed with different programs, so that each performs a different set of operations. In various examples, the processors 748a-748s can manage moving of program code from the DRAM 730 to the accelerators 702a-702n.

The example acceleration engine 700 further includes I/O controllers 744a-744p for communicating with I/O devices 732 in the system. The acceleration engine 700 can communicate with I/O devices over, for example, a processor bus. In some examples, the processor bus can be implemented using Peripheral Component Interconnect (PCI) and/or a variation of the PCI bus protocol. The processor bus can connect the acceleration engine 700 to I/O devices such as, for example, input and output devices, memory controllers, storage devices, and/or network interface cards, among other things. In some examples, the I/O controllers 744-744p can enable the acceleration engine 700 to act as an I/O device for a host processor. For example, the acceleration engine 700 can be the recipient of input data from the host processor, and a command indicating an operation to be performed on the input data (e.g., a particular computation or analysis). In the illustrated example, the acceleration engine 700 includes p I/O controllers 744a-744p, each of which may include a separate root complex and may communicate with a separate set of I/O devices 732. In other examples, other standardized bus protocols, such as Ultra Path Interconnect (UPI) can be used for the host bus. In other examples, a proprietary bus protocol can be used.

Movement of data in the acceleration engine 700 can be managed by one or more processors 748a-748s, which can also be referred to as data management processors. In the example of FIG. 7, the acceleration engine 700 includes s processors 748a-748s incorporated into the device (e.g., on the same silicon die). In other examples, the processors 748a-748s can be external to the acceleration engine 700 (e.g., on a different die and/or in a different package). In some examples, the processors 748a-748s can manage the movement of data from I/O devices 732 to the accelerators 702a-702n or the DRAM 730. For example, input data may be located at an I/O device 732 or in processor memory, and the processors 748a-748s can move the input from the I/O device 732 or processor memory into an accelerator or into DRAM 730. As another example, program code for the accelerators 702a-702n may be located on an I/O device 732 or in processor memory.

The example acceleration engine 700 further includes DMA engines 746a-746d that can move data between the accelerators 702a-702n, DRAM controllers 742a-742k, and I/O controllers 744a-744p. In the illustrated example, the acceleration engine 700 includes d DMA engines 746a-746d. In some implementations, the DMA engines 746a-746d can be assigned to specific tasks, such as moving data from the DRAM controllers 742a-742d to the accelerators 702a-702n, or moving data between the I/O controllers 744a-744p and the accelerators 702a-702n. These tasks can be assigned, for example, by enqueueing descriptors with the DMA engines 746a-746d, where a descriptor identifies an address for a block of data and an operation (e.g., a read or a write) to perform. A descriptor, for example, can direct a DMA engine to instruct a DMA controller to read a block of data from DRAM 730. A descriptor can, as a further example, instruct the DMA engine to write data, read by the DMA controller, to an accelerator. Further descriptors can be used to move data from an accelerator to DRAM 730.

In various examples, each of the processors 748a-748s can be responsible for managing the data movement for a different accelerator. In some examples, a processor may manage the data movement for more than one accelerator. Similarly, in various examples, each of the processors 748a-748s can be assigned to one or more DMA engines 746a-746d. In these and other examples, associations between processors 748a-748s, accelerators 702a-702n, and DMA engines 746a-746d are determined by program code being executed by each respective processor.

In the example acceleration engine 700, the various components can communicate over a chip interconnect 720. The chip interconnect 720 primarily includes wiring for routing data between the components of the acceleration engine 700. In some cases, the chip interconnect 720 can include a minimal amount of logic, such as multiplexors to control the direction of data, flip-flops for handling clock domain crossings, and timing logic.

Figure 8:
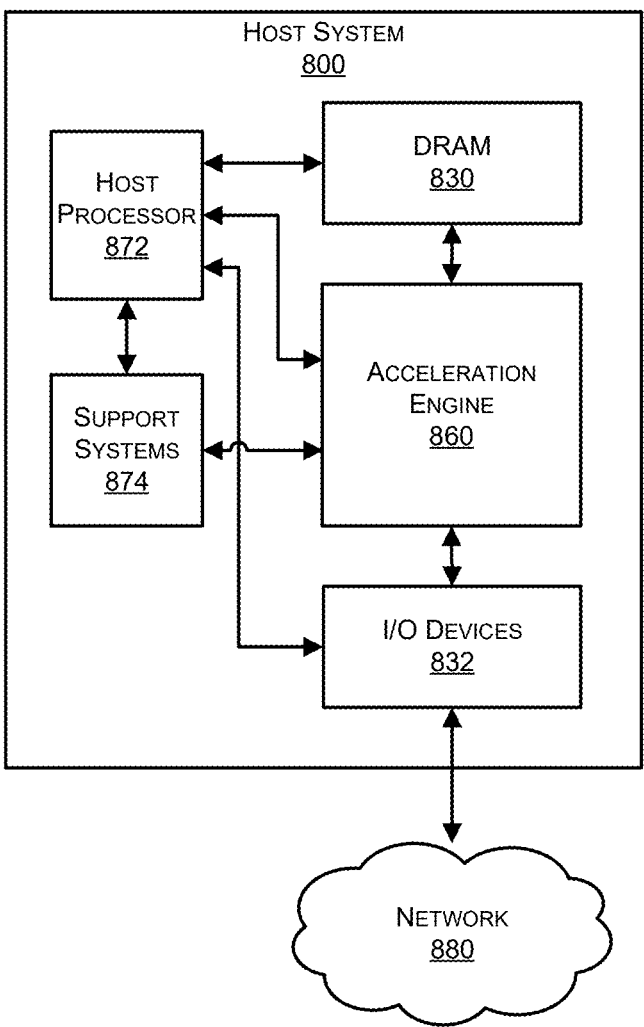
FIG. 8 illustrates a block diagram of an example of a host system.

FIG. 8 includes a block diagram that illustrates an example of a host system 800 in which an acceleration engine 860 can be used. The acceleration engine 860 of FIG. 8 is an example of a device that can include one or more accelerators such as is illustrated in FIG. 7. The example host system 800 of FIG. 8 includes the acceleration engine 860, a host processor 872, DRAM 830 or processor memory, I/O devices 832, and support systems 874. In various implementations, the host system 800 can include other hardware that is not illustrated here. In some embodiments, the host processor 872 can be an example of the host device 204, and the DRAM 830 can be an example of the main memory 212.

The host processor 872 is a general-purpose integrated circuit that is capable of executing program instructions. In some examples, the host processor 872 can include multiple processing cores. A multi-core processor may include multiple processing units within the same processor. In some examples, the host system 800 can include more than one host processor 872. In some examples, the host processor 872 and the acceleration engine 860 can be one chip, such as, one or more integrated circuits within the same package.

In various examples, the host processor 872 can communicate with other components in the host system 800 over one or more communication channels. For example, the host system 800 can include a host processor bus, which the host processor 872 can use to communicate with the DRAM 830, for example. As another example, the host system 800 can include an I/O bus, such as a PCI-based bus, over which the host processor 872 can communicate with the acceleration engine 860 and/or the I/O devices 832, for example. In various examples, the host system 800 can, alternatively or additionally, include other communication channels or busses, such as serial busses, power management busses, storage device busses, and so on.

In some examples, software programs executing on the host processor 872 can receive or generate input for processing by the acceleration engine 860. In some examples, the programs can select an appropriate neural network to execute for a given input. For example, a program may be for language translation, and can select one or more neural networks capable of speech recognition and/or machine translation. In these and other examples, the programs can configure the acceleration engine 860 with the neural network to execute, and/or can select a neural network processing engine on the acceleration engine 860 that has previously been configured to execute the desired neural network. In some examples, once the acceleration engine 860 has started an inference on input data, the host processor 872 can manage the movement of data (such as weights, instructions, intermediate results, results of conditional layers, and/or final results) into or out of the acceleration engine 860.

In some examples, a software program that is using the acceleration engine 860 to conduct an inference can read the result from a conditional layer from the acceleration engine 860 and/or from a storage location, such as in DRAM 830.

In these examples, the program can determine what action the neural network should take next. For example, the program can determine to terminate the inference. As another example, the program can determine to change the direction of the inference, which can be translated by lower level code and/or the neural network processor to a next layer to execute. In these and other examples, the execution flow of the neural network can be coordinated by software.

The DRAM 830 is memory that is used by the host processor 872 for storage of program code that the host processor 872 is in the process of executing, as well as values that are being operated on. In some examples, the data for a neural network (e.g., weight values, instructions, and other data) can be all or partially stored in the DRAM 830. DRAM is a common term for processor memory, and though DRAM is volatile memory, processor memory can be volatile and/or non-volatile. Though not illustrated here, the host system 800 can include other volatile and non-volatile memories for other purposes. For example, the host system 800 can include a Read-Only Memory (ROM) that stores boot code for booting the host system 800 at power on, and/or Basic Input/Output System (BIOS) code.

Though not illustrated here, the DRAM 830 can store instructions for various programs, which can be loaded into and be executed by the host processor 872. For example, the DRAM 830 can be storing instructions for an operating system, one or more data stores, one or more application programs, one or more drivers, and/or services for implementing the features disclosed herein.

The operating system can manage and orchestrate the overall operation of the host system 800, such as scheduling tasks, executing applications, and/or controller peripheral devices, among other operations. In some examples, a host system 800 may host one or more virtual machines. In these examples, each virtual machine may be configured to execute its own operating system. Examples of operating systems include Unix, Linux, Windows, Mac OS, iOS, Android, and the like. The operating system may, alternatively or additionally, be a proprietary operating system.

The data stores can include permanent or transitory data used and/or operated on by the operating system, application programs, or drivers. Examples of such data include web pages, video data, audio data, images, user data, and so on. The information in the data stores may, in some examples, be provided over the network(s) to user devices. In some cases, the data stores may additionally or alternatively include stored application programs and/or drivers. Alternatively or additionally, the data stores may store standard and/or proprietary software libraries, and/or standard and/or proprietary application user interface (API) libraries. Information stored in the data stores may be machine-readable object code, source code, interpreted code, or intermediate code.

The drivers can include programs that provide communication between components in the host system 800. For example, some drivers can provide communication between the operating system and peripheral devices or I/O devices 832. Alternatively or additionally, some drivers may provide communication between application programs and the operating system, and/or application programs and peripheral devices accessible to the host system 800. In many cases, the drivers can include drivers that provide well-understood functionality (e.g., printer drivers, display drivers, hard disk drivers, Solid State Device drivers, etc.). In other cases, the drivers may provide proprietary or specialized functionality.

The I/O devices 832 can include hardware for connecting to user input and output devices, such as keyboards, mice, pens, tablets, voice input devices, touch input devices, displays or monitors, speakers, and printers, among other devices. The I/O devices 832 can also include storage drives and/or network interfaces for connecting to a network 880. For example, the host system 800 can use a network interface to communicate with storage devices, user terminals, other computing devices or servers, and/or other networks, among various examples.

In various examples, one or more of the I/O devices 832 can be storage devices. In these examples, the storage devices include non-volatile memory and can store program instructions and/or data. Examples of storage devices include magnetic storage, optical disks, solid state disks, flash memory, and/or tape storage, among others. The storage device can be housed in the same chassis as the host system 800 or may be in an external enclosure. A storage device can be fixed (e.g., attached by screws) or removable (e.g., having a physical release mechanism and possibly a hot-plug mechanism).

Storage devices, the DRAM 830, and any other memory component in the host system 800 are examples of computer-readable storage media. Computer-readable storage media are physical mediums that are capable of storing data in a format that can be read by a device such as the host processor 872. Computer-readable storage media can be non-transitory. Non-transitory computer-readable media can retain the data stored thereon when no power is applied to the media. Examples of non-transitory computer-readable media include ROM devices, magnetic disks, magnetic tape, optical disks, flash devices, and solid state drives, among others. As used herein, computer-readable storage media does not include computer-readable communication media.

In various examples, the data stored on computer-readable storage media can include program instructions, data structures, program modules, libraries, other software program components, and/or other data that can be transmitted within a data signal, such as a carrier wave or other transmission. The computer-readable storage media can, additionally or alternatively, include documents, images, video, audio, and other data that can be operated on or manipulated through the use of a software program.

In various examples, one or more of the I/O devices 832 can be PCI-based devices. In these examples, a PCI-based I/O device includes a PCI interface for communicating with the host system 800. The term "PCI" or "PCI-based" may be used to describe any protocol in the PCI family of bus protocols, including the original PCI standard, PCI-X, Accelerated Graphics Port (AGP), and PCI-Express (PCIe) or any other improvement or derived protocols that are based on the PCI protocols discussed herein. The PCI-based protocols are standard bus protocols for connecting devices, such as a local peripheral device, to a host device. A standard bus protocol is a data transfer protocol for which a specification has been defined and adopted by various manufacturers. Manufacturers ensure that compliant devices are compatible with computing systems implementing the bus protocol, and vice versa. As used herein, PCI-based devices also include devices that communicate using Non-Volatile Memory Express (NVMe). NVMe is a device interface specification for accessing non-volatile storage media attached to a computing system using PCIe.

A PCI-based device can include one or more functions. A "function" describes the hardware and/or software of an operation that may be provided by the PCI-based device. Examples of functions include mass storage controllers, network controllers, display controllers, memory controllers, serial bus controllers, wireless controllers, and encryption and decryption controllers, among others. In some cases, a PCI-based device may include more than one function. For example, a PCI-based device may provide a mass storage controller and a network adapter. As another example, a PCI-based device may provide two storage controllers, to control two different storage resources. In some implementations, a PCI-based device may have up to eight functions.

In some examples, the PCI-based device can include single-root I/O virtualization (SR-IOV). SR-IOV is an extended capability that may be included in a PCI-based device. SR-IOV allows a physical resource (e.g., a single network interface controller) to appear as multiple virtual resources (e.g., sixty-four network interface controllers). Thus, a PCI-based device providing a certain functionality (e.g., a network interface controller) may appear to a device making use of the PCI-based device to be multiple devices providing the same functionality. The functions of an SR-IOV-capable storage adapter device may be classified as physical functions (PFs) or virtual functions (VFs). Physical functions are fully featured functions of the device that can be discovered, managed, and manipulated. Physical functions have configuration resources that can be used to configure or control the storage adapter device. Physical functions include the same configuration address space and memory address space that a non-virtualized device would have. A physical function may have a number of virtual functions associated with it. Virtual functions are similar to physical functions, but are light-weight functions that may generally lack configuration resources, and are generally controlled by the configuration of their underlying physical functions. Each of the physical functions and/or virtual functions may be assigned to a respective thread of execution (such as for example, a virtual machine) running on a host device.

In various implementations, the support systems 874 can include hardware for coordinating the operations of the acceleration engine 860. For example, the support systems 874 can include a microprocessor that coordinates the activities of the acceleration engine 860, including moving data around on the acceleration engine 860. In this example, the microprocessor can be an integrated circuit that can execute microcode. Microcode is program code that can enable an integrated circuit to have some flexibility in the operations that the integrated circuit can execute, but because the program code uses a limited instruction set, the microprocessor may have more limited capability than the host processor 872. In some examples, the program executed by the microprocessor is stored on the hardware of microprocessor, or on a non-volatile memory chip in the host system 800. In some examples, the microprocessor and the acceleration engine 860 can be on chip, such as one integrated circuit on the same die and in the same package.

In some examples, the support systems 874 can be responsible for taking instructions from the host processor 872 when programs executing on the host processor 872 request the execution of a neural network. For example, the host processor 872 can provide the support systems 874 with a set of input data and a task that is to be performed on the set of input data. In this example, the support systems 874 can identify a neural network that can perform the task, and can program the acceleration engine 860 to execute the neural network on the set of input data. In some examples, the support systems 874 only needs to select an appropriate neural network processing engine of the neural network processor. In some examples, the support systems 874 may need to load the data for the neural network onto the acceleration engine 860 before the acceleration engine 860 can start executing the neural network. In these and other examples, the support systems 874 can further receive the output of executing the neural network, and provide the output back to the host processor 872.

In some examples, the operations of the support systems 874 can be handled by the host processor 872. In these examples, the support systems 874 may not be needed and can be omitted from the host system 800.

In various examples, the host system 800 can include a combination of host systems, processor nodes, storage subsystems, and I/O chassis that represent user devices, service provider computers or third-party computers.

User devices can include computing devices to access an application (e.g., a web browser or mobile device application). In some examples, the application may be hosted, managed, and/or provided by a computing resources service or service provider. The application may enable a user to interact with the service provider computer to, for example, access web content (e.g., web pages, music, video, etc.). The user device may be a computing device such as, for example, a mobile phone, a smart phone, a personal digital assistant (PDA), a laptop computer, a netbook computer, a desktop computer, a thin-client device, a tablet computer, an electronic book (e-book) reader, a gaming console, etc. In some examples, the user device may be in communication with the service provider computer over one or more networks. Additionally, the user device may be part of the distributed system managed by, controlled by, or otherwise part of the service provider computer (e.g., a console device integrated with the service provider computers).

The host system 800 can also represent one or more service provider computers. A service provider computer may provide a native application that is configured to run on user devices, which users may interact with. The service provider computer may, in some examples, provide computing resources such as, but not limited to, client entities, low latency data storage, durable data storage, data access, management, virtualization, cloud-based software solutions, electronic content performance management, and so on. The service provider computer may also be operable to provide web hosting, databasing, computer application development and/or implementation platforms, combinations of the foregoing or the like. In some examples, the service provider computer may be provided as one or more virtual machines implemented in a hosted computing environment. The hosted computing environment can include one or more rapidly provisioned and released computing resources. These computing resources can include computing, networking and/or storage devices. A hosted computing environment may also be referred to as a cloud computing environment. The service provider computer may include one or more servers, perhaps arranged in a cluster, as a server farm, or as individual servers not associated with one another, and may host application and/or cloud-based software services. These servers may be configured as part of an integrated, distributed computing environment. In some examples, the service provider computer may, additionally or alternatively, include computing devices such as for example a mobile phone, a smart phone, a personal digital assistant (PDA), a laptop computer, a desktop computer, a netbook computer, a server computer, a thin-client device, a tablet computer, a gaming console, etc. In some instances, the service provider computer may communicate with one or more third party computers.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in the preceding figures, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain examples require at least one of X, at least one of Y, or at least one of Z to each be present.

Various examples of this disclosure are described herein, including the best mode known to the inventors for carrying out the disclosure. Variations of those examples may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system to perform in-situ scan testing in a field operating environment, the system comprising:
    an accelerator device comprising a plurality of computing cores, a management controller, and a local memory coupled via an interconnect;
    a high bandwidth memory (HBM) device coupled to the accelerator device; and
    a host device coupled to the accelerator device via a host interface,
    wherein the host device is operable to:
        preload test content as a user workload onto the HBM device, wherein the test content includes a test configuration file, and multiple vector sets that each includes a test stimuli vector, an expected result vector, and a mask vector;
        load a utility test program onto the local memory of the accelerator device; and
        assert a program execution signal to the management controller to initiate the in-situ scan testing of the accelerator device,
    wherein, upon receiving the program execution signal, the management controller is operable to execute the utility test program to:
        isolate a computing core under test by masking outputs from the computing core under test to the interconnect;
        configure a scan testing interface of the accelerator device to select an internal test path that accesses the local memory for scan testing;
        apply the test content to perform the in-situ scan testing of the computing core under test; and
        write to a predefined address to indicate completion of the in-situ scan testing to the host device, and
    wherein the in-situ scan testing of the computing core under test is performed without affecting functional connectivity of the accelerator device with the host device via the host interface.

2. The system of claim 1, wherein applying the test content to perform the in-situ scan testing of the computing core under test includes:
    configuring the computing core under test into a scan test mode according to the test configuration file; and
    for each vector set from the multiple vector sets:
        loading the test stimuli vector, the expected result vector, and the mask vector from the HBM device onto the local memory;
        providing the test stimuli vector from the local memory to the scan testing interface to apply the test stimuli vector to the computing core under test;
        obtaining a response vector from the scan testing interface;
        applying the mask vector to the response vector to generate a test result vector;
        comparing the test result vector with the expected result vector to determine whether a fault is detected in the computing core under test; and
        writing the test result vector to the HBM device.

3. The system of claim 1, wherein the host device is further operable to poll the predefined address to determine the completion of the scan testing.

4. The system of claim 1, wherein the scan testing interface of the accelerator device is operable to select an external test path that accesses external pins of the accelerator device to perform the scan testing of the accelerator device prior to deployment of the accelerator device into the field operating environment.

5. A method for performing in-situ scan testing of an integrated circuit (IC) device that is coupled to a main memory, the IC device having a plurality of functional circuit blocks, a management controller, and a local memory coupled via an interconnect, the method comprising:
    preloading test content from a host device onto the main memory coupled to the IC device;
    loading a utility test program onto the local memory of the IC device;
    causing the management controller to execute the utility test program to load the test content from the main memory onto the local memory; and
    applying the test content to perform scan testing of one or more of the functional circuit blocks while maintaining functional connectivity with the host device.

6. The method of claim 5, wherein causing the management controller to execute the utility test program includes asserting a program execution signal to the management controller to initiate the in-situ scan testing of the IC device.

7. The method of claim 5, wherein execution of the utility test program includes isolating the one or more of the functional circuit blocks under test by masking outputs from the one or more of the functional circuit blocks under test to the interconnect.

8. The method of claim 7, wherein the IC device includes a block mask register that includes a respective mask configuration bit for each functional circuit block, and wherein outputs of each functional circuit block are gated by the respective mask configuration bit.

9. The method of claim 5, wherein the IC device includes a scan testing interface coupled to an internal test path that accesses the local memory and an external test path that accesses external pins of the IC device, and wherein execution of the utility test program includes configuring the scan testing interface to select the internal test path.

10. The method of claim 5, wherein the test content is preloaded as a user workload from the host device, and the test content includes a test configuration file, a test stimulus vector, an expected result vector, and a mask vector.

11. The method of claim 10, wherein applying the test content includes configuring the one or more of the functional circuit blocks into a scan test mode according to the test configuration file.

12. The method of claim 10, wherein applying the test content includes:
    providing the test stimulus vector from the local memory to a scan testing interface;
    obtaining a response vector from the scan testing interface;
    applying the mask vector to the response vector to generate a test result vector; and
    comparing the test result vector with the expected result vector to determine whether a fault is detected.

13. The method of claim 12, further comprising writing the test result vector to the main memory.

14. The method of claim 5, wherein the test content is preloaded as a user workload from the host device, and the test content includes multiple vector sets that each includes a test stimuli vector, an expected result vector, and a mask vector, and wherein the multiple vector sets are loaded into the local memory in a piecemeal manner.

15. The method of claim 5, wherein the utility test program provides an address that the management controller writes to for indicating test completion, and wherein the host device polls the address to determine when the in-situ scan testing is complete.

16. An integrated circuit (IC) device comprising:

a plurality of functional circuit blocks;

an interconnect;

a scan testing interface coupled to the interconnect;

a local memory;

a block mask register configured to store respective mask configuration bits for a corresponding plurality of functional circuit blocks; and a management controller coupled to the local memory, wherein the management controller is operable to execute a utility test program to perform in-situ scan testing of a functional circuit block by:

isolating the functional circuit block;

configuring the scan testing interface to select an internal test path that accesses the local memory;

loading test content from a main memory into the local memory via the interconnect, wherein the test content is preloaded into the main memory by a host device;

configuring the functional circuit block into a scan test mode; and applying the test content from the local memory to perform the in-situ scan testing of the functional circuit block while maintaining functional connectivity with the host device.

17. The IC device of claim 16, wherein applying the test content includes:

providing a test stimulus vector from the test content to the scan testing interface;

obtaining a response vector from the scan testing interface; and applying a mask vector from the test content to the response vector to generate a test result vector.

18. The IC device of claim 17, wherein applying the test content includes:

comparing the test result vector with an expected result vector from the test content;

writing the test result vector to the main memory upon detection of a fault; and writing to a predetermined address indicating test completion, wherein the host device polls the predetermined address to determine when the in-situ scan testing is complete.

19. The IC device of claim 16, wherein the test content is preloaded as a user workload from the host device, and the test content includes a test configuration file, and wherein the functional circuit block is configured into the scan test mode according to the test configuration file.

20. The IC device of claim 16, further comprising a block mask register configured to store respective mask configuration bits for the plurality of functional circuit blocks, wherein isolating the functional circuit block under test includes masking outputs from the functional circuit block to the interconnect by setting a corresponding mask configuration bit in the block mask register for the functional circuit block.

* * * * *